United States Patent [19]
Ryat

[11] Patent Number: 5,444,361
[45] Date of Patent: Aug. 22, 1995

[54] WIDEBAND LINEAR AND LOGARITHMIC SIGNAL CONVERSION CIRCUITS

[75] Inventor: Marc H. Ryat, Santa Clara, Calif.

[73] Assignee: SGS-Thomson Microelectronics, Inc., Carrollton, Tex.

[21] Appl. No.: 70,274

[22] Filed: Jun. 1, 1993

Related U.S. Application Data

[63] Continuation-in-part of Ser. No. 31,647, Mar. 15, 1993, which is a continuation-in-part of Ser. No. 950,091, Sep. 23, 1992.

[51] Int. Cl.⁶ ............................... G05F 3/16
[52] U.S. Cl. ............................ 323/312; 323/315
[58] Field of Search ............... 323/312, 313, 315, 316, 323/281, 317; 307/490, 491; 363/73

[56] References Cited

U.S. PATENT DOCUMENTS

| | | | |
|---|---|---|---|
| 4,004,247 | 1/1977 | Van de Plassche | 330/30 D |
| 4,479,086 | 10/1984 | Nagano | 323/315 |
| 4,703,249 | 10/1987 | De La Plaza et al. | 323/316 |
| 4,733,196 | 3/1988 | Menniti et al. | 330/288 |
| 4,740,766 | 4/1988 | Metz | 323/316 |
| 4,937,516 | 6/1990 | Sempel | 323/315 |
| 4,952,866 | 8/1990 | Van Tuijl | 323/315 |
| 4,970,452 | 11/1990 | Barbu et al. | 323/317 |
| 4,980,584 | 12/1990 | Goff et al. | 307/492 |
| 4,990,803 | 2/1991 | Gilbert | 307/492 |
| 4,990,864 | 2/1991 | Kwan | 330/256 X |
| 5,012,133 | 4/1991 | Hughes | 307/352 |
| 5,038,053 | 8/1991 | Djenguerian et al. | 307/310 |
| 5,173,656 | 12/1992 | Seevinck et al. | 323/314 |

OTHER PUBLICATIONS

Barber et al., "A True Logarithmic Amplifier for Radar IF Applications", *IEEE Jou. Solid-State Cir.*, vol. SC-15, No. 3, Jun. 1980, p. 291.

Kimura, "A CMOS Logarithmic IF Amplifier with Unbalanced Source-Coupled Pairs", *IEEE Jou. Solid-State Cir.*, vol. 28, No. 1, Jan. 1993, p. 78.

Huijsing et al., "A Monolithic Analog Exponential Converter", *IEEE Jou. Solid-State Circuits*, vol. SC-15, No. 2, Apr. 1980, p. 162.

Wassenaar et al., "New Techniques For High-Frequency RMS to DC Conversion Based on a Multi-Functional V-to-I Convertor", *IEEE Jou. Solid-State Cir.* vol. 23, No. 3, Jun. 1988.

*Primary Examiner*—Thomas M. Dougherty
*Assistant Examiner*—Adolf Berhane
*Attorney, Agent, or Firm*—Richard A. Bachand; Lisa K. Jorgenson; Richard K. Robinson

[57] ABSTRACT

A cascode mirror circuit, referred to as a "half-cascode mirror", or "HCM" has first (cascode), second (active), and third (base control) transistors. The cascode and active transistors are connected in series at a first node, the series being connected between a second node and a reference potential. The cascode transistors has its base connected to a second reference voltage. The base control transistor is connected between the supply voltage and a base of the active transistors, with its base connected between the first reference current source and the cascode transistor. Depending upon the selection of input and output signal locations, the circuit can perform various functions, including the generation of an output circuit that varies linearly, logarithmically, or exponentially with an input current, and the generation of an output voltage that varies linearly with the input current.

65 Claims, 3 Drawing Sheets

WIDEBAND LINEAR AND LOGARITHMIC SIGNAL CONVERSION CIRCUITS

CROSS-REFERENCES TO RELATED APPLICATIONS

This application is a continuation-in-part of U.S. patent application Ser. No. 08/031,647, filed Mar. 15, 1993, entitled "Linear Transconductors", said application being a continuation-in-part of U.S. patent application Ser. No. 07/950,091, filed Sep. 23, 1992, entitled "A Precise Current Generator", by applicant herein, which claims priority from French Application 91/12278, filed Sep. 30, 1991, by applicant herein, all of which are incorporated herein by reference.

BACKGROUND OF THE INVENTION

1. Field of the Invention

This invention relates to improvements in electronic circuits, and more particularly to improvements in linear and logarithmic signal conversion circuits, and to improvements in linear and logarithmic voltage and current conversion circuits in which the improved cascode mirror circuits may be embodied.

2. Relevant Art

In the past, circuits used for signal conversion, more particularly voltage-to-current or current-to-voltage conversion, suffered numerous deficiencies. Often, for example, the linearity of the circuits was affected by parasitic emitter or base resistors of the transistors used in their design. Additionally, since typically the input to most widely used circuits is applied to the base element of an input transistor, a high swing capability could not be achieved.

Most of the circuits previously employed used operational amplifiers or buffers in closed loop structures, as well as PNP-type transistors, and, consequently, the speed of the circuit was less than that which might otherwise have been achieved. In order to make closed loop systems stable, compensation capacitors were typically employed. Such compensation capacitors, however, resulted in lower speed and overall larger sized circuits. The necessary PNP transistors of many circuits made their stability even more difficult to ensure.

Furthermore, many of the circuits previously employed produced an output that was dependent upon the beta of the transistors of the circuit. This resulted in a loss of high temperature stability of their transfer function.

SUMMARY OF THE INVENTION

In light of the above, it is, therefore, an object of the invention to provide an improved signal conversion circuit.

It is another object of the invention to provide an improved signal conversion circuit of the type described that can be used for voltage-to-current conversion or current-to-voltage conversion depending on the selective interconnections to the circuit and the selection and sizing of the circuit components.

It is another object of the invention to provide an improved signal conversion circuit of the type described that can produce highly linear signal conversion, and that is compatible with single ended or differential modes, and can additionally be used in beta independent class AB operation.

It is another object of the invention to provide an improved signal conversion circuit of the type described in which the linearity of the circuit is not affected by the parasitic emitter or base resistors of the transistors of the circuit.

It is yet another object of the invention to provide a signal conversion circuit of the type described that can achieve a high swing capability.

It is still another object of the invention to provide a signal conversion circuit of the type described that can achieve fast operation with quasi-open-loop structures.

It is still another object of the invention to provide a signal conversion circuit of the type described that requires no compensation capacitors, enabling simple and compact structures to be achieved in integrated circuits or the like.

It is still another object of the invention to provide an improved signal conversion circuit of the type described in which the outputs are essentially independent of the beta of the transistors used, enabling temperature-independent transfer functions to be achieved.

It is still another object of the invention to provide a signal conversion circuit of the type described that can operate with low supply voltages and can accurately convert low input signal levels with high gain.

It is yet another object of the invention to provide a signal conversion circuit of the type described that can operate over a wide frequency band without the use of PNP components.

It is an object of the invention to provide an improved voltage or current mode analog building block circuit that can accept voltage or current input signals and produce current or voltage output signals.

It is another object of the invention to provide improved voltage-to-current converter circuits, embodying the improved building block circuit of the invention.

It is another object of the invention to provide improved current-to-voltage converter circuits, embodying the improved building block circuit of the invention.

It is another object of the invention to provide an improved signal conversion circuit of the type described that can produce logarithmic signal conversion, and that is compatible with single ended or differential modes.

It is another object of the invention to provide an improved signal conversion circuit of the type described that can produce exponential signal conversion, and that is compatible with single ended or differential modes.

It is another object of the invention to provide improved current-to-current converter circuits, embodying the improved building block circuit of the invention.

It is another object of the Invention to provide improved voltage-to-voltage converter circuits, embodying the improved building block circuit of the invention.

These and other objects, features and advantages of the invention will be apparent to those skilled in the art from the following detailed description of the invention, when read in conjunction with the accompanying drawings and appended claims.

In accordance with a broad aspect of the invention, a cascode mirror circuit for connection between a supply voltage and a first reference voltage has first, second, and third transistors. A first reference current source is connected at one side to said supply voltage. The first and second transistors are connected in series between the first reference current source and the first reference voltage, the first transistor having a base connected to a second reference voltage. The third transistor is connected between the supply voltage and a base of the second transistor, and has a base connected between the first reference current source and the first transistor. An input signal receiving node is provided between the first and second transistors, and an output circuit is arranged to provide an output signal proportional to a current flowing in the second transistor.

If needed, a biasing potential can be provided between the second and third transistors to raise the voltage at the connection between the current source and the first transistor.

The circuit can be connected as a voltage-to-current converter, or as a current-to-voltage converter, a voltage amplifier, or a current amplifier, depending upon the location and manner of application of input and output signals. In applications in which the cascode mirror circuit receives an input voltage, an input voltage receiving node is connected to receive an input signal with an input resistor provided to connect the input voltage to the input signal receiving node. The output circuit is an output transistor having a base connected to a base of the second transistor. A current mirror circuit is thereby formed to copy the current flowing in the second transistor for output.

In applications in which the cascode mirror circuit receives an input current, an impedance is connected between the first and second transistors, and the input current signal receiving node is located between the impedance and the first transistor. A node between the second transistor and the impedance is connected to provide the voltage output signal.

In both circuit configurations, the first, second, third, and output transistors can be bipolar or MOS transistors.

In accordance with another broad aspect of the invention, a nonlinear cascode mirror circuit is presented for connection between a supply voltage and a first reference voltage. The nonlinear cascode mirror circuit includes first, second, and third transistors, said first and second transistors being connected in series between an input node and the first reference voltage, wherein an input current being can be applied between the supply voltage and said input node. The first transistor has a base connected to a second reference voltage, and said third transistor is connected between the supply voltage and a base of the second transistor, and has a base connected between the input node and said first transistor. An output circuit is arranged to provide an output signal nonlinearly proportional to a current flowing in said second transistor. In a preferred embodiment, said output signal is logarithmically proportional to the input current signal.

If desired, a biasing potential can be provided between the second and third transistors to raise the voltage at the connection between the current source and the first transistor, and an additional cascode transistor can be added in series with the first transistor, with its base appropriately biased with a reference potential that can be the same or different from the third reference voltage.

The first, second, third, and output transistors can be either NPN, PNP, or MOS transistors, depending upon the design needs.

In still another broad aspect of the invention, a nonlinear cascode mirror circuit for connection between a supply voltage and a first reference voltage is presented. The nonlinear circuit includes first, second, and third transistors. A first source of reference current is connected at one side to the supply voltage, the first and second transistors being connected in series between another side of the first source of reference current the first reference voltage, the first transistor having a base connected to a second reference voltage. The third transistor is connected between the supply voltage and a base of the second transistor, and has a base connected between the input node and the first transistor. A current input node is provided between the first and second transistors, wherein an input current can be applied between the supply voltage and the current input node. An output circuit arranged to provide an output signal nonlinearly proportional to a current flowing in the second transistor.

In a preferred embodiment, the output signal is exponentially proportional to the current flowing in the second transistor.

Again, if desired the nonlinear cascode mirror circuit can further include a biasing potential between the second and third transistors to raise the voltage at the connection between the current source and the first transistor. The output circuit comprises a resistor to develop an output voltage proportional to the current in the second transistor, and an output transistor has its base connected to a base of the first transistor. The first, second, third, and output transistors can be NPN, PNP, or MOS transistors ad needed.

BRIEF DESCRIPTION OF THE DRAWINGS

The invention is illustrated in the accompanying drawings, in which.

In the various figures of the drawings, like reference numerals are used to denote like or similar parts.

DETAILED DESCRIPTION OF THE PREFERRED EMBODIMENTS

Figure 1:
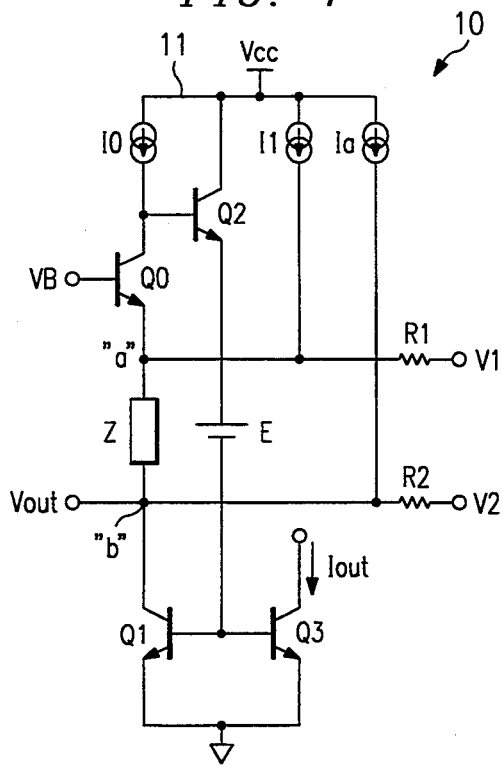
FIG. 1 is an electrical schematic diagram of a general circuit constructed with bipolar transistors showing a "half-cascode mirror" circuit in accordance with a preferred embodiment of the invention that can be adapted for use as a voltage-to-current converter, a current-to-voltage converter, a current converter, or a voltage converter.

An electrical schematic diagram, in accordance with a preferred embodiment the invention, of a general circuit referred to herein as a "half cascode mirror" circuit (or HCM) 10 is shown in FIG. 1. The circuit 10 has been generalized to show some of the various possible configurations that can be selectively modified to assume, depending upon the particular application in which the circuit may be used. The different constituent parts can be independently included, removed, or duplicated to implement the many diverse functions of the HCM. Thus, for example, the circuit 10 of FIG. 1 can be adapted for use as a voltage-to-current converter, a current-to-voltage converter, a current mirror, or a voltage converter through various circuit modification selections, as described below. It should be noted that although the embodiment 10 shown utilizes NPN type bipolar transistors, which is preferred, PNP transistors can be used to equal advantage with appropriate modification to the power supply and signal voltages.

The HCM circuit 10 includes three NPN bipolar transistors, Q0, Q1, and Q2. Transistor Q0 is referred to herein as a "cascode" transistor, and transistor Q1 is referred to as an "active" transistor. Transistor Q2, is referred to as a "base current compensating" transistor. Thus, in the embodiment 10 shown, a reference current source I0 is connected between a $V_{cc}$ rail 11 and the collector of the cascode transistor Q0. Although I0 is shown of fixed value, it can be varied, if needed. (In fact, an input current can be applied at the location of I0 for logarithmic signal conversion, as described below with respect to FIG. 10.)

The base of the cascode transistor Q0 is connected to a bias reference voltage, VB, which, as will become apparent, can be, for example, $2V_{BE}$ above ground. The emitter of the cascode transistor Q0 is connected to the collector of the active transistor Q1 through a series impedance, Z. As will become apparent, the impedance, Z, is used principally in those instances in which a current is used as the input signal; consequently, the impedance may have a value of 0, or be omitted entirely in voltage-to-current conversion applications. The emitter of the active transistor Q1 is connected to a reference potential, or ground.

The base current compensating transistor Q2 has its collector connected to the $V_{cc}$ rail 11 and its emitter connected to the base of the active transistor Q1. The base current compensating transistor Q2 serves to provide a voltage level shift between the base of the active device Q1 and the collector of the cascode device Q0. In essence, the base current compensating device isolates the base of the active device Q1 with respect to the collector of the cascode transistor Q0. As shown an additional level shifting voltage source E can be used for further voltage level translation, to specify the voltage on the collector of the transistor Q0.

The base of the current compensating transistor Q2 is connected to the collector of the cascode transistor Q0. A first voltage input V1 is connected through a series resistor R1 to node "a" at the emitter of the cascode transistor Q0. A current source I1 is optionally connected between the $V_{cc}$ rail and the node a to provide extra current to the active transistor Q1 in certain operating conditions, specifically, when the voltage appearing at V1 is less than the voltage with respect to ground at node "a", since such condition could cause the cascode transistor Q0 to cease conduction. The current I1, therefore, will add to the current supplied through the resistor R1, as described below in detail. Finally, a second voltage input may be attached to the node "b" at the collector of the active transistor Q1 through series resistor R2. A current source Ia may also be connected between the collector of the active transistor Q1 and the $V_{cc}$ rail 11 to provide additional bias current.

A current output $I_{out}$ from the circuit 10 is developed by a mirror transistor Q3. Since the base and emitter of transistors Q1 and Q3 are interconnected, the current that flows through the mirror transistor Q3 will necessarily copy or mirror the current flowing through the active transistor Q1, thereby providing a current output from the circuit. In the general circuit embodiment 10, the output can be either in the form of a current $I_{out}$, taken at the collector of transistor Q3, or a voltage, $V_{out}$, taken at the collector of transistor Q1 from node "b". Thus, the transistors Q0, Q1, and Q2 form the HCM to accept the current input fixed by I0. Therefore, I0 is always flowing through the transistor Q0 whatever the choice made for the other components. This results in:

$$V_{\nu e 0} = V_t \cdot \log\left(\frac{I0}{I_S 0}\right)$$

As a consequence, node "a" will be at a fixed voltage, $VB - V_{be(Q0)}$, independently of the devices connected to node "a", such as, for example, resistor, R1. This is true for any values of $I_{out}$ and $V_{out}$. Thus, when a voltage is applied to the input node V1, the current that flows through the resistor R1 is equal to the difference between the voltage applied to the node V1 minus the voltage on node "a" divided by the value of the resistor R1. This current adds to the current I0 and flows through the active transistor Q1 to ground. This current also is mirrored in the output current $I_{out}$ through transistor Q3. If desired, an output voltage can be developed on the node "b".

The circuits described below with reference to FIGS. 2–10 are based on this simple property of the generalized HCM 10 that allows an output current ($I_{out}$) or voltage ($V_{out}$) to be derived that is a linear function of an input voltage (V1, V2) or current (I1)

According to the circuit 10 of FIG. 1, and its various possible combinations resulting from the presence or absence of V1, V2, R1, R2, I1 and Z, at least four basic types of functions can be implemented in a linear way:

(1) voltage-to-current conversion:

-continued $$I_{out} = I0 + I1 + Ia + \left(\frac{V1 - a}{R1}\right) +$$

$$\frac{\left\{V2 - Z \cdot \left[I0 + I1 + \left(\frac{V1 - a}{R1}\right)\right]\right\}}{R2}$$

$$= A \cdot V1 + B \cdot V2 + C$$

where:

$$A = \frac{\left(1 - \frac{Z}{R2}\right)}{R1}$$

$$B = \frac{1}{R2}$$

$$C = I0 \cdot \left(1 - \frac{Z}{R2}\right) + I1 + Ia + a \cdot \left(\frac{\frac{Z}{R2} - 1}{R1}\right)$$

and with $a = VB - V_{be}0$.

(2) current-to-voltage conversion:

$$V_{out} = a - Z \cdot \left[I0 + I1 + \frac{V1 - a}{R1}\right]$$

$$= D \cdot I1 + E$$

where: $D = -Z$ $$E = a \cdot \left(1 + \frac{Z}{R1}\right) - Z \cdot \left(I0 + \frac{V1}{R1}\right)$$

(3) current-to-current conversion:

$$I_{out} = F \cdot I1 + G$$
where:

$$F = 1 - \frac{Z}{R2}$$

$$G = \left[I0 + \frac{V1 - a}{R1}\right] \cdot \left(1 - \frac{Z}{R2}\right) + Ia + \frac{V2}{R2}$$

(4) voltage-to-voltage conversion:

$$V_{out} = H \cdot V1 + J$$
where:

$$H = -\left(\frac{Z}{R1}\right)$$

$$J = a \cdot \left(1 + \frac{Z}{R1}\right) - Z \cdot (I0 + I1)$$

It can therefore be seen that the generalized circuit of FIG. 1 can be connected in various ways, for example, to enable voltage-to-current conversion, or, conversely, current-to-voltage conversion. Specific voltage-to-current and current-to-voltage conversion options for the circuit 10 are shown respectively in circuit 30 described below with reference to FIG. 3 and circuit 40 described with reference to FIG. 7 below.

Figure 2:
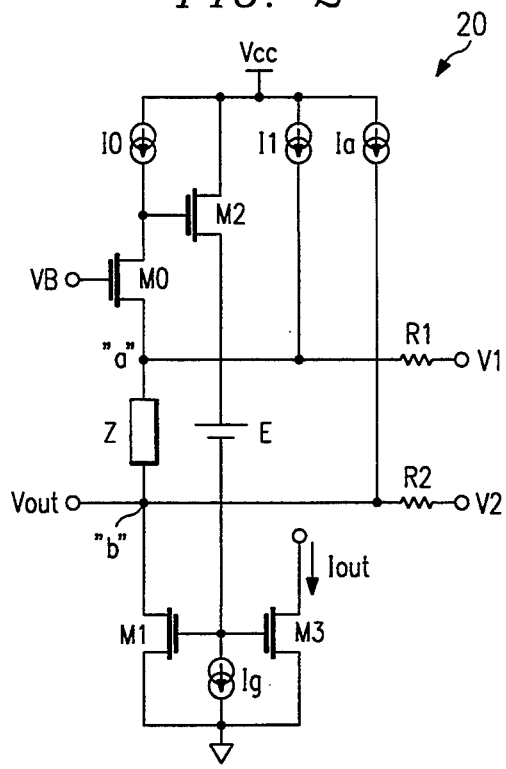
FIG. 2 is an electrical schematic diagram of a general circuit constructed with MOS transistors showing a "half-cascode mirror" circuit modified from that of FIG. 1.

A MOS embodiment 20 of the HCM circuit of FIG. 1 is shown in FIG. 2. In the construction of the generalized MOS circuit 20, the MOS devices M0–M3 can be substituted directly for the bipolar devices shown in the bipolar embodiment 10 shown in FIG. 1. Additionally, a gate current source Ig can be provided between the gates of the active transistor M1 and output transistor M3 to the reference potential, or ground, as shown.

Figure 3:
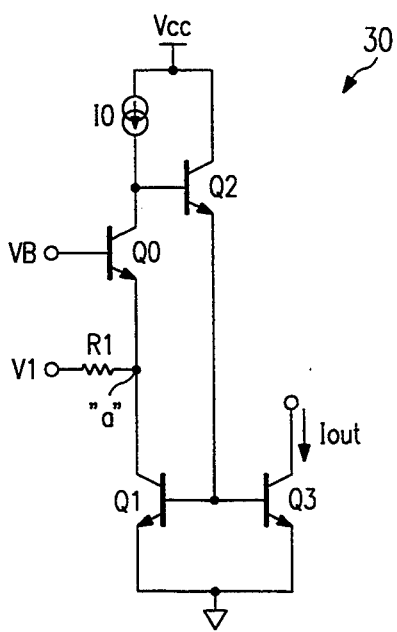
FIG. 3 is an electrical schematic diagram of a voltage-to-current converter circuit constructed with bipolar transistors, employing the "half-cascode mirror" circuit modified from that of FIG. 1.

With reference now to FIG. 3, a specific voltage-to-current converter embodiment B0 is established by modifying the general circuit 10 of FIG. 1 to omit the impedance Z, or make the impedance Z equal to 0, and by omitting the second voltage input terminal V2. Thus, in operation, it will be seen that with a constant base voltage, for example, $2V_{BE}$, applied to the base of the cascode transistor Q0, a current supplied by the current source I0 is forced to flow through the cascode transistor Q0 and through node "a".

When an input signal voltage is applied to the input terminal V1, the input current will be applied to node "a" via the resistor R1. Since the current flowing through the cascode transistor Q0 as well as the voltage on node "a" are constant, a current change will appear through the active transistor Q1 as a result of the additional current from the input signal. The increased current through the active transistor Q1 is then mirrored by the mirror transistor Q3 to provide the current output.

Figure 4:
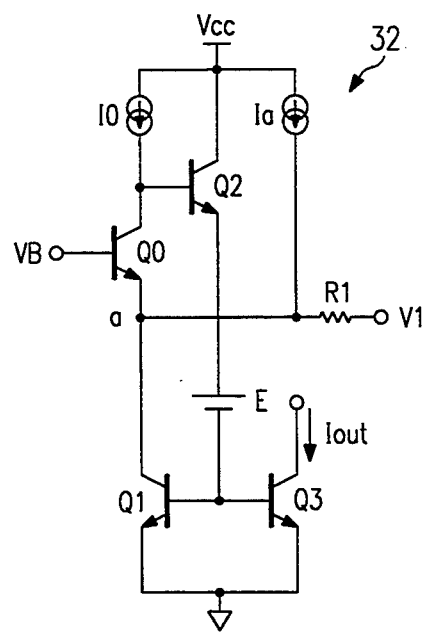
FIG. 4 is an electrical schematic diagram of a voltage-to-current converter circuit constructed with bipolar transistors, employing the "half-cascode mirror" circuit of FIG. 1, utilizing supplemental bias current and voltage sources.

An additional embodiment 32 of the circuit 30 of FIG. 3 is shown in FIG. 4 in which an additional current source Ia is connected between the $V_{cc}$ rail and node "a" to provide additional drive current. This embodiment is particularly useful in the event that the current $$\frac{a - V1}{R1}$$

becomes larger than I0. Also, if desired, since the collector of the cascode transistor Q0 will be at $2V_{BE}$, a level shifting potential E can be provided to raise the potential of the emitter of the base current compensating transistor Q2.

Figure 5:
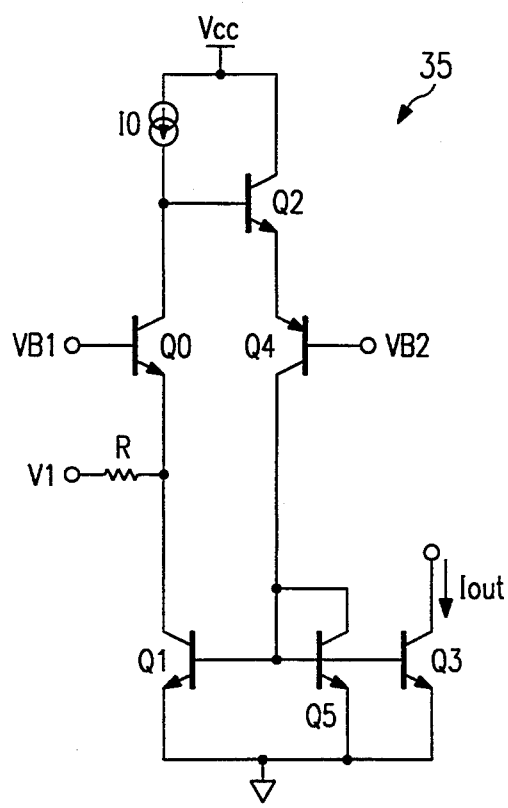
FIG. 5 is an electrical schematic diagram of a voltage-to-current converter circuit constructed with bipolar transistors, similar to the circuit of FIG. 4, employing a supplemental reference potential.
Figure 6:
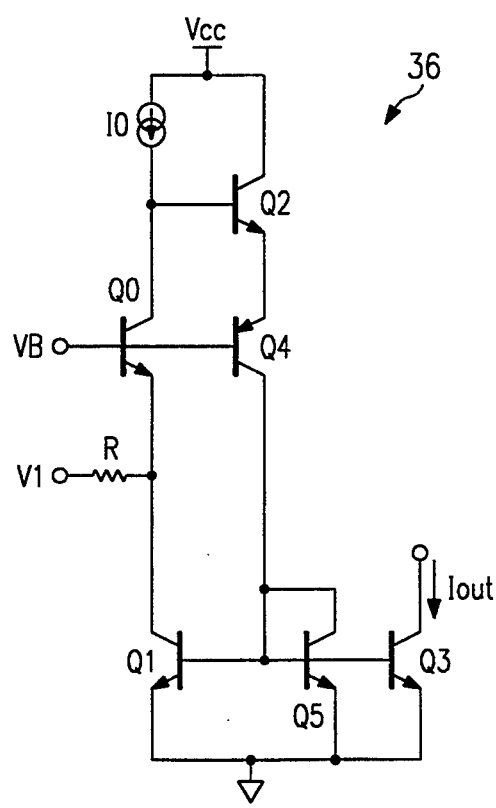
FIG. 6 is an electrical schematic diagram of a voltage-to-current converter circuit constructed with bipolar transistors, similar to the circuit of FIG. 5, and utilizing a common reference potential.

As an alternative embodiment for the provision of the level shifting or bias voltage E by a potential source as represented in the circuit 32 FIG. 4, a transistor biasing or level shifting circuit can be provided as shown in the circuit embodiment 35 in FIG. 5. In the circuit 35, a PNP transistor Q4 is connected between the base current compensating transistor Q2 and the base of the active transistor Q1. The base of the transistor Q4 is connected to a bias voltage VB2, that may be the same or different from the bias voltage VB1 applied to the base of the cascode transistor Q0. An additional NPN transistor Q5 is connected between the base of the active transistor Q1 and ground, with its base also being connected to the base of the mirroring transistor Q3. If desired, the bias voltages VB1 and VB2 are the same, the bases of the PNP transistor Q4 and the cascode transistor Q0 can be connected together, as shown in the circuit embodiment 36 shown in FIG. 6.

Figure 7:
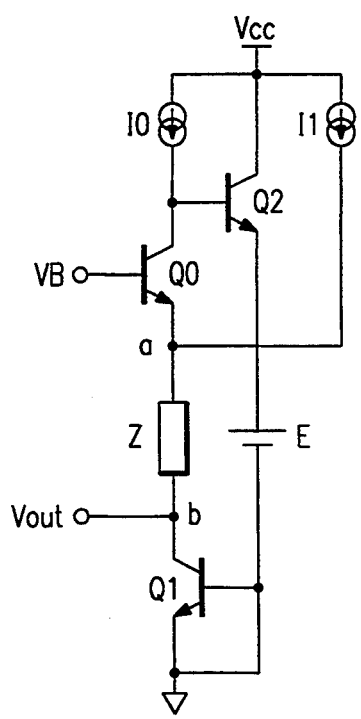
FIG. 7 is an electrical schematic diagram of a current-to-voltage converter circuit constructed with bipolar transistors, employing the "half-cascode mirror" circuit of FIG. 1.

With reference now to FIG. 7, a specific current-to-voltage converter embodiment 40 of the HCM circuit of the invention is shown as an alternate additional modification to the general circuit of FIG. 1. The circuit 40 is derived from the generalized circuit 10 shown in FIG. 1 by the omission of the two voltage input terminals V1 and V2 and their respective resistors, R1 and R2. In addition, the current input signal is applied between the $V_{cc}$ rail and node "a", the input current being denoted by the designation I1. The impedance Z is provided between the emitter of the cascode transistor Q0 and the collector of the active device Q1 through which the input current as well as the current I0 delivered through the cascode transistor Q0 are flowing. The voltage drop across the impedance Z can be realized at the output terminal on node "b" at the collector of the active transistor Q1.

Other variations will be apparent to those skilled in the art, the voltage-to-current converter embodiment 30 and current-to-voltage converter embodiment 40 being described as two examples of possible modifications that can be made to the generalized circuit 10 of FIG. 1. Similar circuits, of course, can be realized by the same or similar modifications.

It will be appreciated that various useful embodiments of these functions, and their implementation in particular basic analog circuits can be made with only minor modifications, and through selection of the signal input and output nodes and biasing techniques. It should be emphasized that although the different elements E, Z, R1, etc. may be added to the circuits to create more diverse combinations.

Figure 8:
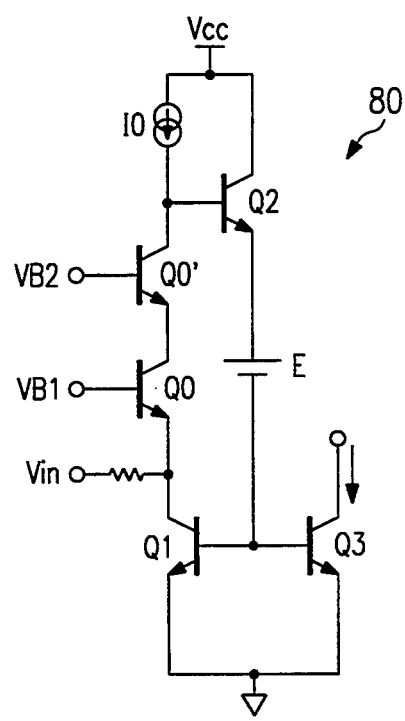
FIG. 8 is an electrical schematic diagram of a "half-cascode mirror" circuit derived from that of FIG. 1 employing an additional, bipolar cascode transistor.
Figure 9:
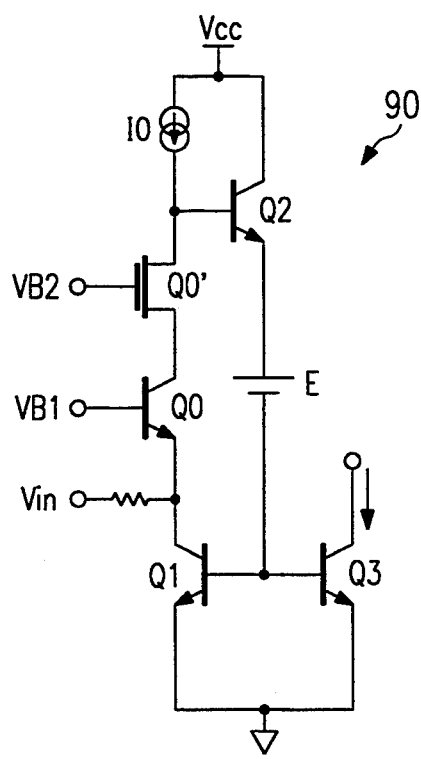
FIG. 9 is an electrical schematic diagram of a "half-cascode mirror" circuit derived from that of FIG. 1 employing an additional, MOS cascode transistor.

For example, as shown in FIGS. 8 and 9, an additional cascode transistor Q0′ can be added in series with the original cascode transistor Q0. In FIG. 8 the additional cascode transistor Q0′ is an bipolar NPN transistor. In the embodiment 90 of FIG. 9, the additional cascode transistor Q0′ is a MOS transistor.

Figure 10:
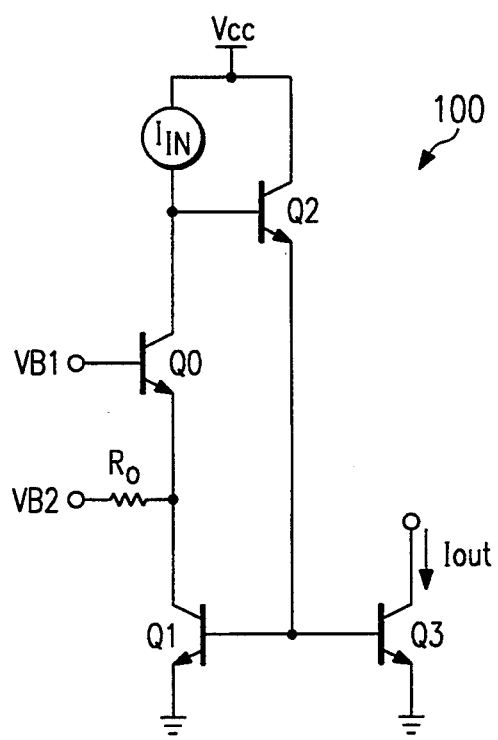
FIG. 10 is an electrical schematic diagram of a circuit constructed in accordance with another preferred embodiment of the invention for performing logarithmic signal conversion.

It will be understood that the circuit embodiments of FIGS. 1-9 are linear circuits. However, the HCM is capable of performing logarithmic signal conversions, as well. Thus, as shown in FIG. 10, a circuit embodiment 100 is shown that performs logarithmic signal conversion on an input current signal $I_{in}$ applied between the supply voltage $V_{cc}$ and the collector of the cascode transistor Q0. Thus, as implied above, the voltage produced across the resistor $R_o$ will be:

$$VB2 - \left[ VB1 - V_t \cdot \log\left(\frac{I_{IN}}{I_{S0}}\right) \right]$$

The voltage VB2 can be, for example, $VB1-V_{be(Q2)}$ at $V_{be}0$. Thus, the output current is a function of the input current that has nonlinear or logarithmic terms. It will be appreciated, of course, that additional circuitry or stages may be utilized to particular advantage to subtractor cancel any dc components that may exist in the output signal.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. A cascode mirror circuit comprising:
   first and second transistors;
   a first reference current source having a connection at one side to a supply voltage and at another side to said first transistor;
   said first and second transistors having conduction paths connected in series between the first reference current source and a first reference voltage, said first transistor having a current control element connected to a second reference voltage;
   a current compensating transistor having a conduction path connected between the supply voltage and a current control element of the second transistor, and having a current control element connected at a node between the first reference current source and said first transistor;
   an input signal receiving node being provided between said first and second transistors; and
   an output circuit arranged to provide an output signal proportional to a current conducted by the conduction path of said second transistor.

2. The cascode mirror circuit of claim 1, further comprising a biasing potential between the current control element of said second transistor and said current compensating transistor to raise a voltage at the connection between the first reference current source and said first transistor.

3. The cascode mirror circuit of claim 2 wherein said biasing potential is provided by a potential source between the current compensating transistor and the current control element of said second transistor.

4. The cascode mirror circuit of claim 1 wherein said input signal receiving node is connected to receive an input voltage, and said output circuit is a current mirror circuit connected to copy a current flowing in said second transistor.

5. The cascode mirror circuit of claim 4 further comprising an input resistor to connect the input voltage to said input signal receiving node.

6. The cascode mirror circuit of claim 5 wherein said output circuit comprises an output fourth transistor having a current control element connected to a current control element of said second transistor.

7. The cascode mirror circuit of claim 5 further comprising a cascode fifth transistor connected between said first transistor and the first reference current source, said fifth transistor having a current control element connected to a third reference voltage.

8. The cascode mirror circuit of claim 7 wherein said second and third reference voltages are equal.

9. The cascode mirror circuit of claim 7 wherein said second and third reference voltages are from the same source.

10. The cascode mirror circuit of claim 10 wherein said first, second, current compensating, and fourth transistors are bipolar transistors.

11. The cascode mirror circuit of claim 10 wherein said first, second, current compensating, and fourth transistors are NPN transistors.

12. The cascode mirror circuit of claim 5 wherein said first, second, current compensating, and fourth transistors are MOS transistors.

13. The cascode mirror circuit of claim 1 further comprising an impedance connected between said first and second transistors, wherein said input signal receiving node is located between said impedance and said first transistor and is connected to receive an input current, and a node between said second transistor and said impedance is connected to provide a voltage output signal.

14. The cascode mirror circuit of claim 13 wherein said first, second, current compensating, and fourth transistors are bipolar transistors.

15. The cascode mirror circuit of claim 14 wherein said first, second, current compensating, and fourth transistors are NPN transistors.

16. The cascode mirror circuit of claim 13 wherein said first, second, current compensating, and fourth transistors are MOS transistors.

17. A cascode mirror circuit, comprising:
first, second and third transistors;
a first reference current source having a connection at one side to a supply voltage and at another side to said first transistor;
said first and second transistors being connected in series between the first reference current source and a first reference voltage, said first transistor having a current control element connected to a second reference voltage;
said third transistor being connected between the supply voltage and a current control element of the second transistor, and having a current control element connected between the first reference current source and said first transistor;
an input signal receiving node being provided between said first and second transistors;
an output circuit arranged to provide an output signal proportional to a current flowing in said second transistor;
a first bias transistor connected between said third transistor and the current control element of said second transistor, said first bias transistor having a current control element connected to a third reference voltage; and
a second bias transistor connected between the current control element of said second transistor and said first reference voltage, and having a current control element connected to the current control element of said second transistor, said first and second bias transistors for raising a voltage at the connection between the first reference current source and said first transistor.

18. A voltage-to-current converter, comprising:
a first reference current source connected at one side to a supply voltage;
a first transistor having a conduction path connected on a first side to said first reference current source, and having a current control element connected to a second reference voltage;
a second transistor having a conduction path connected between a first reference voltage and a second side of the conduction path of said first transistor, and having a current control electrode;
a third transistor having a conduction path connected between the supply voltage and the current control element of the second transistor, and having a current control element connected to the first side of the conduction path of said first transistor;
an input resistor connected to apply an input voltage to an input signal receiving node between said first and second transistors; and
an output current mirror connected to provide an output current signal proportional to the current in said second transistor.

19. The voltage-to-current converter of claim 18 further comprising a biasing potential between the current control element of said second transistor and said third transistor to raise the voltage at the connection between the first reference current source and said first transistor.

20. The voltage-to-current converter of claim 19 wherein said biasing potential is provided by a potential source between the third transistor and the current control element of said second transistor.

21. The voltage-to-current converter of claim 18 wherein said output current mirror comprises an output fifth transistor having a current control element connected to a current control element of said second transistor.

22. The voltage-to-current converter of claim 18 further comprising a second reference current source connected between the supply voltage and the input signal receiving node to provide an extended input voltage range of operation of said voltage-to-current converter.

23. The voltage-to-current converter of claim 18 further comprising a fifth transistor connected between said first transistor and the first reference current source, said fifth transistor having a current control element connected to a third reference voltage.

24. The voltage-to-current converter of claim 23 wherein said second and third reference voltages are equal.

25. The voltage-to-current converter of claim 21 wherein said second and third reference voltages are from the same source.

26. The voltage-to-current converter of claim 21 wherein said first, second, third, and fourth transistors are bipolar transistors.

27. The voltage-to-current converter of claim 21 wherein said first, second, third, and fourth transistors are NPN transistors.

28. The voltage-to-current converter of claim 23 wherein said first, second, third, and fourth transistors are MOS transistors.

29. A voltage-to-current converter, comprising:
first, second, and third transistors;
a first reference current source connected at one side to a supply voltage;
said first and second transistors being connected in series, said first transistor being connected to said first reference current source and said second transistor connected to a first reference voltage, said first transistor having a current control element connected to a second reference voltage;
said third transistor being connected between the supply voltage and a current control element of the second transistor, and having a current control element connected between the first reference current source and said first transistor;
an input resistor connected to apply an input voltage to an input signal receiving node between said first and second transistors;
an output current mirror connected to provide an output current signal proportional to the current in said second transistor;
a first bias transistor connected between said third transistor and the current control element of said second transistor, said first bias transistor having a current control element connected to a third reference voltage; and
a second bias transistor connected between the current control element of said second transistor and said first reference voltage, and having a current control element connected to the current control element of said second transistor, said first and second bias transistors for raising the voltage at the connection between the first reference current source and said first transistor.

30. A current-to-voltage converter for connection between a supply voltage and a first reference voltage, comprising:
a first transistor, having a conduction path, and having a current control element connected to a second reference voltage;

a first reference current source connected at one side to a supply voltage and at another side to the conduction path of the first transistor;

an impedance, connected on a first side to the conduction path of said first transistor;

a second transistor having a conduction path connected in series between a second side of said impedance and the first reference voltage, and having a current control electrode; and a third transistor having a conduction path connected between the supply voltage and the current control element of the second transistor, said third transistor having a current control element connected at a node between the first reference current source and said first transistor;

wherein, in response to an input current applied to the first side of said impedance, the current-to-voltage converter presents an output voltage at the second side of said impedance.

31. The current-to-voltage converter of claim 30 further comprising a biasing potential between the current control element of said second transistor and said third transistor to raise a voltage at the connection between the first reference current source and said first transistor.

32. The current-to-voltage converter of claim 31 wherein said biasing potential is provided by a potential source between the current control element of said third transistor and the current control element of said second transistor.

33. A current-to-voltage converter, comprising:

first, second and third transistors, said first transistor having a current control element connected to a second reference voltage;

a first reference current source connected at one side to a supply voltage;

and an impedance, said first transistor being connected in series between one end of said impedance and the first reference current source, said second transistor being connected in series between another side of said impedance and the first reference voltage;

said third transistor being connected between the supply voltage and a current control element of the second transistor, and having a current control element connected between the first reference current source and said first transistor;

a current input signal receiving node between said second reference supply voltage and a node between said first transistor and said one side of said impedance;

an output voltage node between said second transistor and said another side of said impedance;

a first bias transistor connected between said third transistor and the current control element of said second transistor, said first bias transistor having a current control element connected to a third reference voltage; and a second bias transistor connected between the current control element of said second transistor and said first reference voltage, and having a current control element connected to the current control element of said second transistor, said first and second bias transistors for raising a voltage at the connection between the first reference current source and said first transistor.

34. The current-to-voltage converter of claim 33 further comprising a fourth transistor connected between said first transistor and the first reference current source, said fourth transistor having a current control element connected to a fourth reference voltage.

35. The current-to-voltage converter of claim 34 wherein said second and third reference potentials are equal.

36. The current-to-voltage converter of claim 34 wherein said second and third reference potentials are from the same source.

37. The current-to-voltage converter of claim 36 wherein said first, second, third, and fourth transistors are bipolar transistors.

38. The current-to-voltage converter of claim 37 wherein said first, second, third, and fourth transistors are NPN transistors.

39. The current-to-voltage converter of claim 36 wherein said first, second, third, and fourth transistors are MOS transistors.

40. A nonlinear cascode mirror circuit, comprising:

first and second transistors, having conduction paths connected in series, and having current control elements, wherein the conduction path of said first transistor receives an input current from a supply voltage at an input node, wherein the conduction path of the second transistor is connected to a first reference voltage, and wherein the current control element of said first transistor is connected to a second reference voltage;

a third transistor having a conduction path connected between the supply voltage and the current control element of the second transistor, and having a current control element connected to the input node;

a resistor connected between a third reference voltage and a common node at which the conduction paths of said first and second transistors are connected to one another; and an output circuit arranged to provide an output signal nonlinearly proportional to the input current.

41. The nonlinear cascode mirror circuit of claim 40 wherein said output signal is logarithmically proportional to the input current signal.

42. The nonlinear cascode mirror circuit of claim 41 further comprising a biasing potential between the current control element of said second and said third transistor to raise the voltage at the connection between the current source and said first transistor.

43. The nonlinear cascode mirror circuit of claim 42 wherein said biasing potential is provided by a potential source between the third transistor and the current control element of said second transistor.

44. The nonlinear cascode mirror circuit of claim 40 wherein said output circuit is a mirror circuit connected to copy a current flowing in said second transistor.

45. The nonlinear cascode mirror circuit of claim 44 wherein said output circuit comprises an output fourth transistor having a current control element connected to a current control element of said second transistor.

46. The nonlinear cascode mirror circuit of claim 45 further comprising a fifth transistor connected between said first transistor and the input node, said additional fifth having a current control element connected to a third reference voltage.

47. The nonlinear cascode mirror circuit of claim 46 wherein said second and third reference voltages are equal.

48. The nonlinear cascode mirror circuit of claim 46 wherein said second and third reference voltages are from the same source.

49. The nonlinear cascode mirror circuit of claim 47 wherein said first, second, third, and fourth transistors are bipolar transistors.

50. The nonlinear cascode mirror circuit of claim 49 wherein said first, second, third, and fourth transistors are NPN transistors.

51. The nonlinear cascode mirror circuit of claim 47 wherein said first, second, third, and fourth transistors are MOS transistors.

52. A nonlinear cascode mirror circuit, comprising:
first, second, and third transistors;
said first and second transistors being connected in series, said first transistor being connected to an input node and said second transistor being connected to a first reference voltage, wherein an input current can be applied between a supply voltage and said input node, said first transistor having a current control element connected to a second reference voltage;
said third transistor being connected between the supply voltage and a current control element of the second transistor, and having a current control element connected between the input node and said first transistor;
a resistor connected between a third reference voltage and a node between said first and second transistors;
an output circuit arranged to provide an output signal nonlinearly proportional to the input current;
a first bias transistor connected between said third transistor and the current control element of said second transistor, said first bias transistor having a current control element connected to a second reference voltage; and
a second bias transistor connected between the current control element of said second transistor and said first reference voltage, and having a current control element connected to the current control element of said second transistor, said first and second bias transistors for raising the voltage at the connection between the current source and said first transistor.

53. A nonlinear cascode mirror circuit, comprising:
first, second and third transistors;
a first source of reference current connected at one side to said supply voltage;
said first and second transistors having conduction paths connected in series between another side of said first source of reference current and a first reference voltage, said first transistor having a current control element connected to a second reference voltage;
said third transistor having a conduction path connected between the supply voltage and a current control element of the second transistor, and having a current control element;
a current input node located in the series connection between the conduction paths of said first and second transistors, for receiving an input current from said supply voltage, and connected to the current control element of said third transistor; and
an output circuit arranged to provide an output signal nonlinearly proportional to the input current.

54. The nonlinear cascode mirror circuit of claim 53 wherein said output signal is exponentially proportional to the input current.

55. The nonlinear cascode mirror circuit of claim 53 further comprising a biasing potential between the current control element of said second and said third transistor to raise a voltage at the connection between the first source of reference current and said first transistor.

56. The nonlinear cascode mirror circuit of claim 55 wherein said biasing potential is provided by a potential source between the third transistor and the current control element of said second transistor.

57. The nonlinear cascode mirror circuit of claim 53 further comprising a fourth transistor connected between said first transistor and the first source of reference current, said fourth transistor having a current control element connected to a third reference voltage.

58. The nonlinear cascode mirror circuit of claim 57 wherein said second and third reference voltages are equal.

59. The nonlinear cascode mirror circuit of claim 57 wherein said second and third reference voltages are from the same source.

60. The nonlinear cascode mirror circuit of claim 52 wherein said output circuit comprises a resistor to develop an output voltage proportional to the current in said second transistor.

61. The nonlinear cascode mirror circuit of claim 60 wherein said output circuit further comprises an output fifth transistor having a current control element connected to a current control element of said first transistor.

62. The nonlinear cascode mirror circuit of claim 61 wherein said first, second, third, and fifth transistors are bipolar transistors.

63. The nonlinear cascode mirror circuit of claim 62 wherein said first, second, third, and fifth transistors are NPN transistors.

64. The nonlinear cascode mirror circuit of claim 61 wherein said first, second, third, and fifth transistors are MOS transistors.

65. A nonlinear cascode mirror circuit comprising:
first, second and third transistors;
a first source of reference current connected at one side to said supply voltage;
said first and second transistors being connected in series between another side of said first source of reference current and a first reference voltage, said first transistor having a current control element connected to a second reference voltage;
said third transistor being connected between the supply voltage and a current control element of the second transistor, and having a current control element;
a current input node between said first and second transistors, wherein an input current can be applied between said supply voltage and said current input node and wherein the current control element of said third transistor is connected between the current input node and said first transistor;
an output circuit arranged to provide an output signal nonlinearly proportional to an input current;
a first bias transistor connected between said third transistor and the current control element of said second transistor, said first bias transistor having a current control element connected to a second reference voltage; and
a second bias transistor connected between the current control element of said second transistor and said first reference voltage, and having a current control element connected to the current control element of said second transistor, said first and second bias transistors for raising a voltage at the connection between the first source of reference current and said first transistor.

* * * * *